(12) United States Patent
Ogata

(10) Patent No.: US 7,521,293 B2
(45) Date of Patent: Apr. 21, 2009

(54) METHOD OF MANUFACTURING SEMICONDUCTOR DEVICE, SEMICONDUCTOR DEVICE, CIRCUIT BOARD, AND ELECTRONIC INSTRUMENT

(75) Inventor: Yoshiharu Ogata, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 590 days.

(21) Appl. No.: 10/936,557

(22) Filed: Sep. 9, 2004

(65) Prior Publication Data

US 2005/0106781 A1 May 19, 2005

(30) Foreign Application Priority Data

Sep. 24, 2003 (JP) ............................. 2003-330996

(51) Int. Cl.
*H01L 21/782* (2006.01)
*H01L 23/10* (2006.01)
*H01L 31/0352* (2006.01)

(52) U.S. Cl. ....................... 438/119; 438/108; 438/118; 438/126; 438/127

(58) Field of Classification Search ....................... None
See application file for complete search history.

(56) References Cited

U.S. PATENT DOCUMENTS 6,204,564 B1 * 3/2001 Miyata et al. ............... 257/778
6,545,367 B2 4/2003 Sota
6,731,014 B2 * 5/2004 Sota ............................ 257/784
2002/0197771 A1 * 12/2002 Dotta et al. .................. 438/114

FOREIGN PATENT DOCUMENTS

| JP | A 10-335384 | 12/1998 |
|----|-------------|---------|
| JP | A-10-335384 | 12/1998 |
| JP | A 11-067850 | 3/1999 |
| JP | A-11-297752 | 10/1999 |
| JP | A 11-297752 | 10/1999 |
| JP | WO 01/26147 A1 * | 4/2001 |
| JP | A 2003-31602 | 1/2003 |
| JP | A-2003-218157 | 7/2003 |

* cited by examiner

*Primary Examiner*—Zandra Smith
*Assistant Examiner*—Pamela E Perkins
(74) *Attorney, Agent, or Firm*—Oliff & Berridge, PLC

(57) ABSTRACT

A method of manufacturing a semiconductor device uses a substrate on which an interconnect pattern is formed and on which a protective film is formed to include an opening and to cover the interconnect pattern in a region other than the opening. The method includes: attaching an adhesive sheet to an area including the opening and a boundary between the opening and the protective film so that a void is formed due to a level difference between the interconnect pattern and the substrate; softening the adhesive sheet by heating; and causing a semiconductor chip to adhere to the substrate through the adhesive sheet. The protective film includes a groove which connects with the opening, the adhesive sheet is attached except a part of the groove, and the void is discharged through the groove by heating and softening the adhesive sheet.

15 Claims, 6 Drawing Sheets

US 7,521,293 B2

METHOD OF MANUFACTURING SEMICONDUCTOR DEVICE, SEMICONDUCTOR DEVICE, CIRCUIT BOARD, AND ELECTRONIC INSTRUMENT

Japanese Patent Application No. 2003-330996, filed on Sep. 24, 2003, is hereby incorporated by reference in its entirety.

BACKGROUND OF THE INVENTION

The present invention relates to a method of manufacturing a semiconductor device, a semiconductor device, a circuit board, and an electronic instrument.

In recent years, a package for a semiconductor device suitable for high-density mounting has been demanded accompanying a reduction of the size of an electronic instrument. To deal with this demand, a surface-mount package such as a ball grid array (BGA) or a chip scale/size package (CSP) has been developed. In the surface-mount package, a substrate on which an interconnect pattern to be connected with a semiconductor chip is formed may be used.

As a conventional surface-mount package, a semiconductor device in which a semiconductor chip is secured to an interconnect pattern of a substrate using an adhesive sheet such as an anisotropic conductive film (ACF; also called "anisotropic conductive sheet") or a non-conductive film (NCF) has been known (see Japanese Patent Application Laid-open No. 2003-31602, for example).

In a conventional method of manufacturing a semiconductor device, when covering an interconnect pattern on a substrate with an adhesive sheet, it is difficult to prevent air from entering between the interconnect pattern on the substrate and the adhesive sheet and forming voids. It is also difficult to prevent occurrence of cracks in the adhesive sheet due to expansion of voids by heating for curing the adhesive sheet or for reflowing. It is also difficult to prevent migration of the interconnect pattern due to occurrence of cracks and entrance of moisture.

BRIEF SUMMARY OF THE INVENTION

A method of manufacturing a semiconductor device according to one aspect of the present invention uses a substrate on which an interconnect pattern is formed and on which a protective film is formed to include a rectangular opening and to cover the interconnect pattern in a region other than the opening, and the method includes:

attaching an adhesive sheet to an area including the opening and a boundary between the opening and the protective film so that a void is formed in the opening due to a level difference between the interconnect pattern and the substrate;

softening the adhesive sheet by heating; and causing a semiconductor chip to adhere to the substrate through the adhesive sheet, wherein the protective film includes a groove which connects with a corner of the opening, wherein the adhesive sheet is attached except at least a part of the groove, and wherein the void is discharged through the groove by heating and softening the adhesive sheet.

A method of manufacturing a semiconductor device according to another aspect of the present invention uses a substrate on which an interconnect pattern is formed and on which a protective film is formed to include a rectangular opening and to cover the interconnect pattern in a region other than the opening, the method includes:

attaching a porous adhesive sheet to an area including the opening and a boundary between the opening and the protective film so that a void is formed in the opening due to a level difference between the interconnect pattern and the substrate;

softening the adhesive sheet by heating and discharging the void through the porous adhesive sheet; and causing a semiconductor device to adhere to the substrate through the adhesive sheet.

A semiconductor device according to a further aspect of the present invention is manufactured by any of the above methods.

A circuit board according to a still further aspect of the present invention has the above semiconductor device mounted thereon.

An electronic instrument according to a yet further aspect of the present invention has the above semiconductor device.

DETAILED DESCRIPTION OF THE EMBODIMENT

Figure 1A:
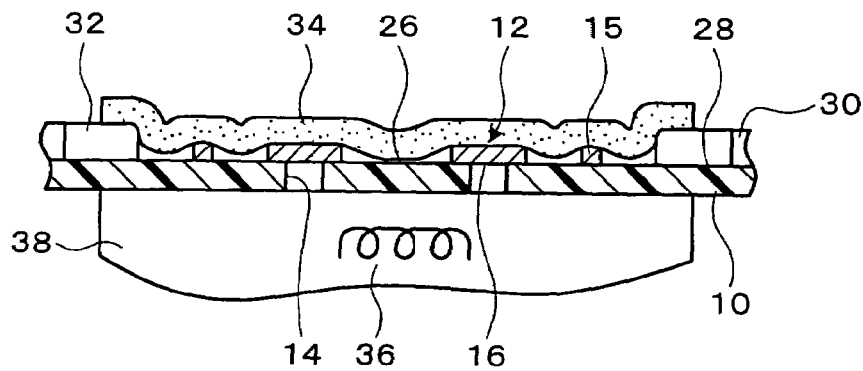
FIGS. 1A to 1D are illustrative of a method of manufacturing a semiconductor device according to a first embodiment.

Embodiments of the present invention may provide a method of manufacturing a highly reliable semiconductor device even having a structure in which an interconnect pattern is covered with an adhesive sheet, a semiconductor device, a circuit board, and an electronic instrument.

(1) A method of manufacturing a semiconductor device according to one embodiment of the present invention uses a substrate on which an interconnect pattern is formed and on which a protective film is formed to include a rectangular opening and to cover the interconnect pattern in a region other than the opening, the method includes:

attaching an adhesive sheet to an area including the opening and a boundary between the opening and the protective film so that a void is formed in the opening due to a level difference between the interconnect pattern and the substrate;

softening the adhesive sheet by heating; and causing a semiconductor chip to adhere to the substrate through the adhesive sheet, wherein the protective film includes a groove which connects with a corner of the opening, wherein the adhesive sheet is attached except at least a part of the groove, and wherein the void is discharged through the groove by heating and softening the adhesive sheet.

According to this embodiment of the present invention, the void due to the level difference can be easily discharged to the outside through the groove in the protective film. Therefore, a method of manufacturing a highly reliable semiconductor device in which air does not enter between the adhesive sheet and the substrate and voids are rarely formed, even having a structure in which the interconnect pattern is covered with the adhesive sheet, can be provided.

(2) With the above method, the adhesive sheet may be a porous adhesive sheet which allows the void to be discharged.

(3) A method of manufacturing a semiconductor device according to another embodiment of the present invention uses a substrate on which an interconnect pattern is formed and on which a protective film is formed to include a rectangular opening and to cover the interconnect pattern in a region other than the opening, the method includes:

attaching a porous adhesive sheet to an area including the opening and a boundary between the opening and the protective film so that a void is formed in the opening due to a level difference between the interconnect pattern and the substrate;

softening the adhesive sheet by heating and discharging the void through the porous adhesive sheet; and causing a semiconductor device to adhere to the substrate through the adhesive sheet.

According to this embodiment of the present invention, the void present in the level difference can be easily discharged to the outside through the holes in the porous adhesive film. Therefore, a method of manufacturing a highly reliable semiconductor device in which air does not enter between the adhesive sheet and the substrate and voids are rarely formed, even having a structure in which the interconnect pattern is covered with the adhesive sheet, can be provided.

(4) With any of the above methods, a plurality of cuts may be formed on an end of the adhesive sheet.

(5) With any of the above methods, the cuts may be formed to reach the boundary between the opening and the protective film.

(6) With any of the above methods, conductive particles may be dispersed in the adhesive sheet, and the interconnect pattern and an electrode of the semiconductor chip may be electrically connected through the conductive particles.

(7) With any of the above methods, the adhesive sheet may be an insulating sheet.

(8) A semiconductor device according to a further embodiment of the present invention is manufactured by any of the above methods.

(9) A circuit board according to a still further embodiment of the present invention has the above semiconductor device mounted thereon.

(10) An electronic instrument according to a yet further embodiment of the present invention has the above semiconductor device.

Embodiments of the present invention are described below with reference to the drawings.

First Embodiment

Figure 1B:
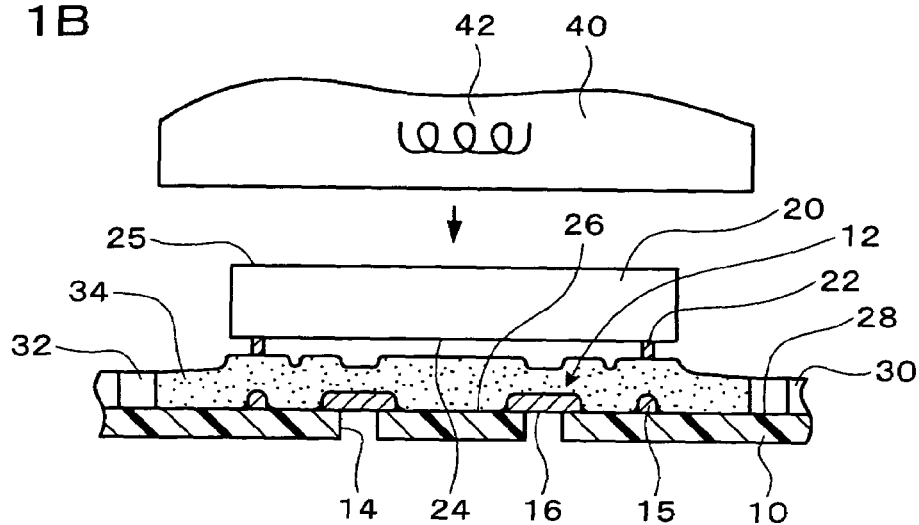
Figure 1C:
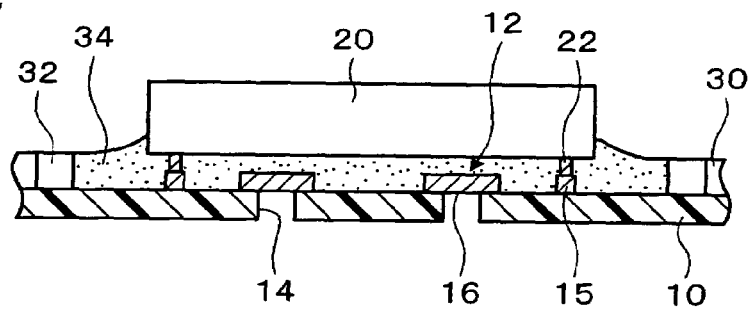
Figure 1D:
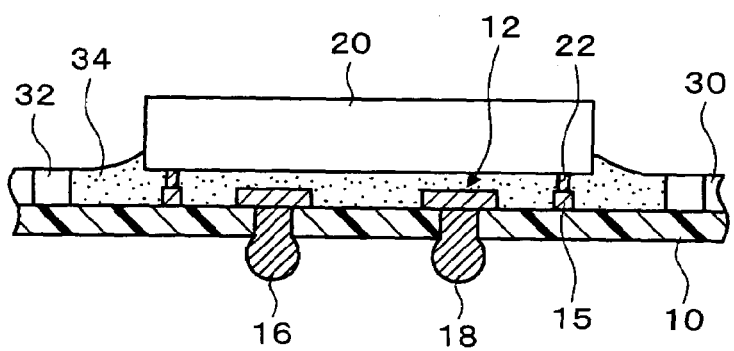
Figure 2:
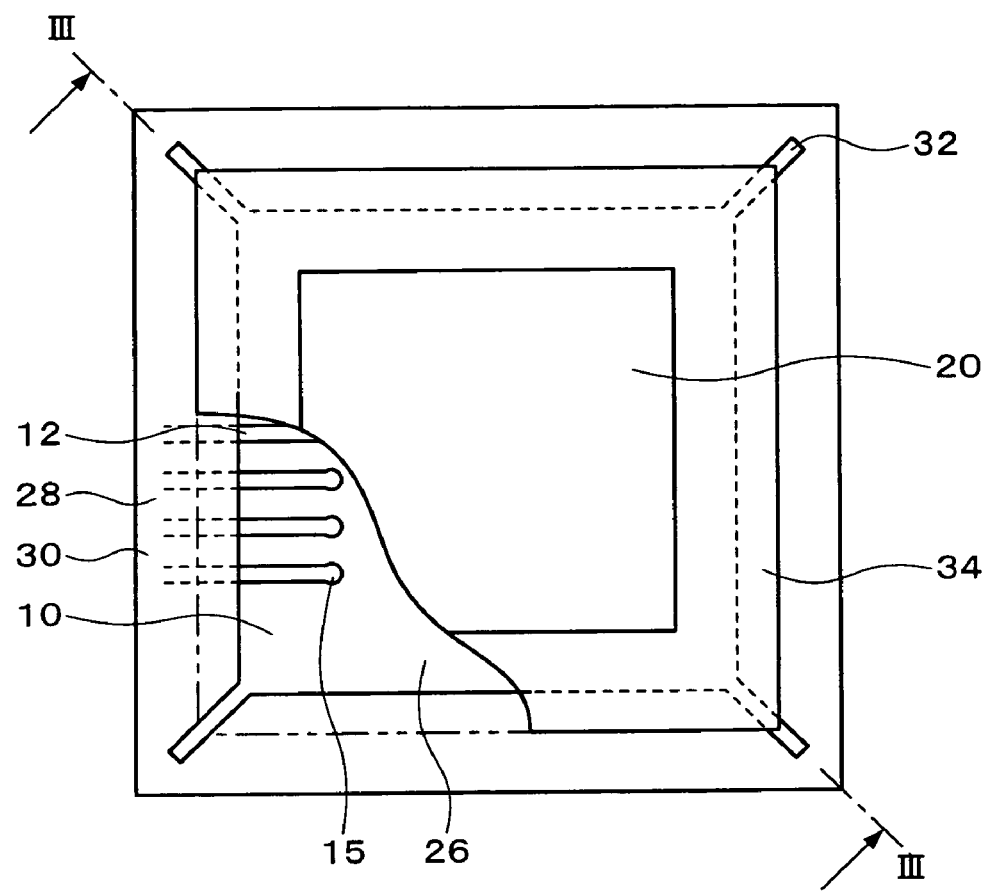
FIG. 2 is illustrative of the method of manufacturing a semiconductor device according to the first embodiment.
Figure 3:
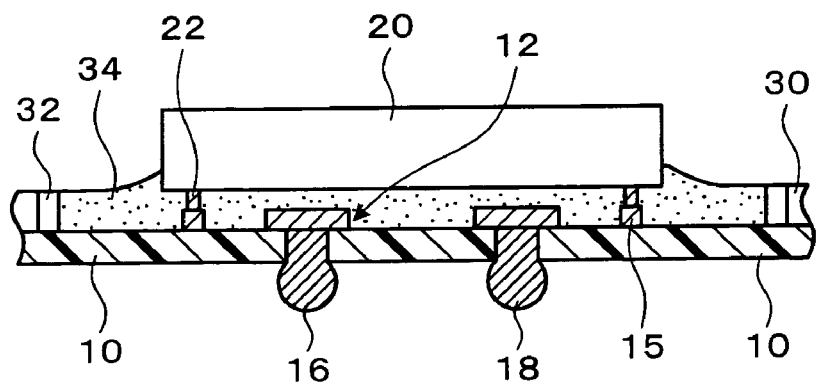
FIG. 3 is a cross-sectional view along the line III-III shown in FIG. 2.

FIGS. 1A to 2 are illustrative of a method of manufacturing a semiconductor device according to the first embodiment of the present invention. FIG. 3 is a cross-sectional view of the semiconductor device shown in FIG. 2 along the line III-III.

(1) In the present embodiment, a substrate 10 in which an interconnect pattern 12 is formed on at least one surface is used, as shown in FIG. 1A. The substrate 10 may be a substrate formed of an organic material such as a flexible substrate, a substrate formed of an inorganic material such as a metal substrate, or a substrate formed of a combination of these materials. A tape carrier may be used as the flexible substrate. A through-hole 14 is formed in the substrate 10. The interconnect pattern 12 is formed across the through-hole 14. A land 15 for connection with an electrode of a semiconductor chip 20 is formed on the substrate, and a land 16 for forming an external electrode is formed on the through-hole 14 as a part of the interconnect pattern 12.

(2) A protective film 30 is formed on the substrate 10. The protective film 30 covers the interconnect pattern 12 to protect the interconnect pattern 12 from moisture or the like. A solder resist is used as the protective film 30, for example. The protective film 30 is formed in a region 28 of the substrate 10 other than a rectangular opening 26 in which the semiconductor chip 20 is mounted so as to cover the interconnect pattern 12 in the region 28. The opening 26 is generally formed to have an area greater than the area of a surface 24 of the semiconductor chip 20 on which an electrode 22 is formed. The protective film 30 may be formed by a printing method (screen printing method) using resin ink, for example.

Grooves 32 are formed in the protective film 30 at the corners of the rectangular opening 26. The groove 32 connects with the corner of the opening 26. The groove 32 may be formed so that one end is connected with the corner of the opening 26 and the other end is positioned outside the adhesion range of an adhesive sheet 34. In the present embodiment, the grooves 32 are formed at four corners. However, the grooves 32 may be formed on four sides of the opening. The groove 32 may be formed for some of the corners or sides. The bottom of the groove 32 may be level with the opening 26, or a layer of the protective film 30 may remain at the bottom of the groove 32. The bottom of the groove 32 may be an inclined surface starting from the opening 26.

(3) The adhesive sheet 34 is attached to the substrate 10 on which the protective film 30 is formed. The adhesive sheet 34 is placed between the semiconductor chip 20 and the interconnect pattern 12 to secure the semiconductor chip 20 to the substrate 10. The adhesive sheet 34 may be an anisotropic conductive film (ACF; also called "anisotropic conductive sheet"), a non-conductive film (NCF), or the like.

The anisotropic conductive film is a film in which conductive particles (conductive fillers) are dispersed in an adhesive (binder). A dispersant may be added to the anisotropic conductive film. Since the conductive particles are dispersed in the anisotropic conductive film, the electrode connection land 15 of the interconnect pattern 12 and the electrode 22 can be electrically connected through the conductive particles. In the case where an adhesive sheet (NCF, for example) which does not contain conductive particles is used, the electrode connection land 15 of the interconnect pattern 12 and the electrode 22 can be electrically connected by applying pressure.

As the adhesive in the adhesive sheet 34, a thermosetting adhesive represented by an epoxy adhesive or a photocurable adhesive represented by an epoxy or acrylate adhesive may be used. An electron-beam curing adhesive or a thermoplastic (thermobonding) adhesive may also be used.

In the present embodiment, the adhesive sheet 34 is attached to the area including the opening 26 in which the semiconductor chip 20 is mounted and the boundary between the opening 26 and the protective film 30, as shown in FIG. 1A. The adhesive sheet 34 may be attached except at least a part of the groove 32. The adhesive sheet 34 may be attached so that the end of the groove 32 is exposed from the adhesive sheet 34. The adhesive sheet 34 is softened by heating. For example, the adhesive sheet 34 may be sufficiently softened by placing the substrate 10 on a first jig 38 provided with a first heater 36. The adhesive sheet 34 may be sufficiently softened by allowing the substrate 10 to stand in a thermostat at a predetermined temperature. The adhesive sheet 34 may be independently heated. The adhesive sheet 34 using a thermosetting adhesive is heated at a temperature at which the adhesive is not cured. It is preferable to heat the adhesive sheet 34 at a temperature of 60 to 100° C. for a retention time of two minutes to one hour.

The adhesive sheet 34 is softened and hangs in a direction determined by gravity. The softened adhesive sheet 34 adheres to the level difference between the interconnect pattern 12 and the substrate 10 and the level difference between the interconnect pattern 12 and the protective film 30. Air pushed out from each level difference or gap by the softened adhesive sheet 34 and air expanded by heating are discharged to the outside through the grooves 32 in the protective film 30 which connect with the four corners of the opening 26. Voids formed in the level difference may be entirely discharged in this step.

(4) As shown in FIG. 1B, the semiconductor chip 20 is placed on the softened adhesive sheet 34. In more detail, the semiconductor chip 20 is placed so that the surface 24 on which the electrode 22 is formed faces the adhesive sheet 34. The semiconductor chip 20 is disposed so that the electrode 22 is positioned on the electrode connection land 15 of the interconnect pattern 12.

(5) As shown in FIG. 1B, the semiconductor chip 20 is pressed against the substrate 10 by pressing a second jig 40 against a surface 25 opposite to the surface 24 on which the electrode 22 is formed. Or, pressure is applied between the semiconductor chip 20 and the substrate 10. This step causes the electrode 22 of the semiconductor chip 20 and the electrode connection land 15 of the interconnect pattern 12 to be electrically connected through the conductive particles in the adhesive sheet 34. The adhesive sheet 34 softened by heating may further enter the level difference between the interconnect pattern 12 and the substrate 10 and the level difference between the interconnect pattern 12 and the protective film 30 to push out the air remaining in the level differences. The air pushed out is discharged to the outside from the grooves 32 in the protective film 30 which are formed to connect with the four corners of the opening 26. As a result, air (or voids) present between the adhesive sheet 34 and the substrate 10 is removed.

The semiconductor chip 20 is heated by using a heater 42 included in the second jig 40. A thermosetting adhesive such as an epoxy adhesive is used as the adhesive in the adhesive sheet 34. Therefore, the adhesive sheet 34 is cured in the contact region with the semiconductor chip 20, whereby the semiconductor chip 20 can be bonded and secured to the substrate 10.

The second jig 40 may apply heat to the adhesive sheet 34 in the area greater than the semiconductor chip 20. The second jig 40 having a planar area greater than the planar area of the semiconductor chip 20 may be used. This causes heat to be easily applied to the periphery of the semiconductor chip 20, whereby the adhesive is cured more securely and the semiconductor chip 20 is secured more reliably.

(6) An external electrode is formed, if necessary. Solder (not shown) is provided to the inside of and the vicinity of the through-hole 14 in the substrate 10 shown in FIG. 1C. A solder ball formed in advance may be placed at this position. The solder is heated in a reflow step to form a solder ball 18 as shown in FIG. 1D. The solder ball 18 becomes an external electrode. In the reflow step, not only the solder, but also the adhesive sheet 34 is heated. The uncured region of the adhesive sheet 34 is cured by this heating.

This configuration prevents air from remaining between the adhesive sheet 34 and the substrate 10, whereby voids are rarely formed. Since voids are not formed by heating for curing the adhesive sheet 34 or for reflowing, occurrence of cracks in the adhesive sheet 34 due to expansion of voids or migration of the interconnect pattern 12 due to moisture which enters the cracks can be prevented. Moreover, since the bonding area is increased, the bonding strength between the semiconductor chip 20 and the substrate 10 can be secured.

The semiconductor device according to the present embodiment includes a configuration which can be derived from the above-described manufacturing method. According to the present embodiment, a highly reliable semiconductor device, even having a structure in which the interconnect pattern 12 is covered with the adhesive sheet 34, can be provided.

Second Embodiment

Figure 4:
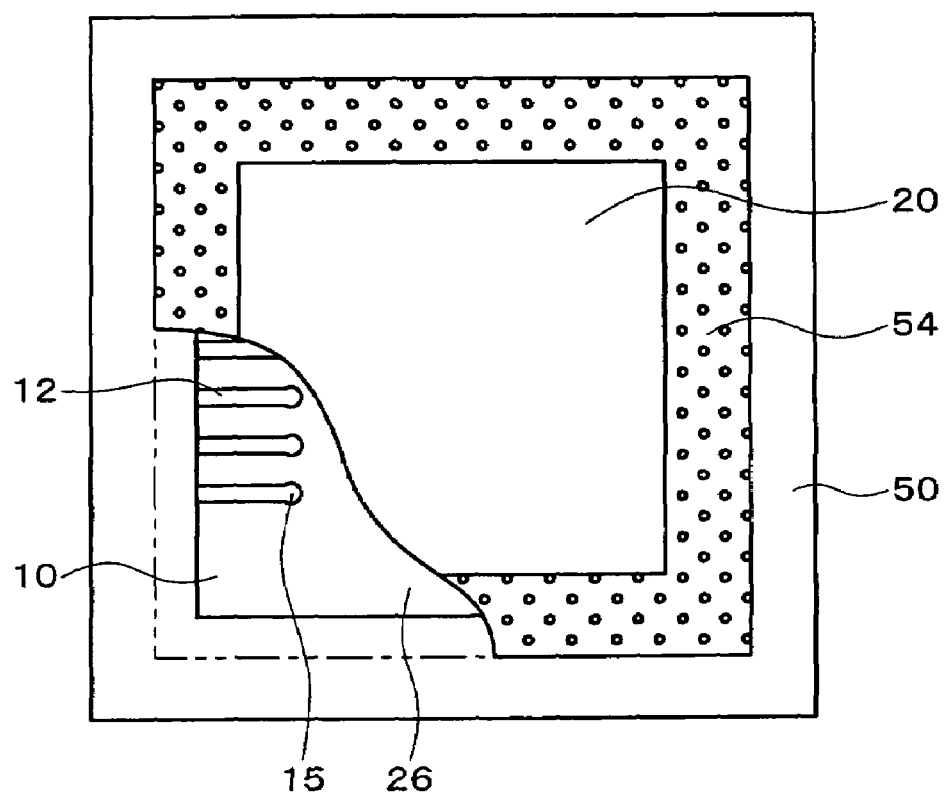
FIG. 4 is illustrative of a method of manufacturing a semiconductor device according to a second embodiment.

FIG. 4 is illustrative of a method of manufacturing a semiconductor device according to the second embodiment of the present invention. The description of the first embodiment is applied to the present embodiment except for configurations and shapes of a protective film 50 and an adhesive sheet 54.

The adhesive sheet 54 shown in FIG. 4 used in the second embodiment has porosity which allows voids (air) to be discharged. The protective film 50 may be formed not to include grooves at the corners of an opening 56 in which the semiconductor chip 20 is mounted.

According to the method of manufacturing a semiconductor device configured as described above, the adhesive sheet 54 is attached to the area including the opening 56 and the boundary between the opening 56 and the protective film 50, as shown in FIG. 1A. The adhesive sheet 54 is softened by heating using the method described in the first embodiment.

The adhesive sheet 54 is softened and hangs in a direction determined by gravity. The softened adhesive sheet 54 adheres to the level difference between the interconnect pattern 12 and the substrate 10 and the level difference between the interconnect pattern 12 and the protective film 50. Air pushed out from the level difference or gap by the softened adhesive sheet 54 and air expanded by heating are discharged to the outside through the holes in the porous adhesive sheet 54.

In the present embodiment, the porous adhesive sheet 54 having a number of minute holes is used. However, predetermined through-holes may be formed in the adhesive sheet 34 used in the first embodiment. It suffices that the through-holes have a diameter of 1 mm or less.

According to the present embodiment, air does not remain between the adhesive sheet 54 and the substrate 10, whereby voids are rarely formed. Therefore, a highly reliable semiconductor device which exhibits effects the same as the effects described in the first embodiment, even having a structure in which the interconnect pattern 12 is covered with the adhesive sheet 54, can be provided.

Third Embodiment

Figure 5:
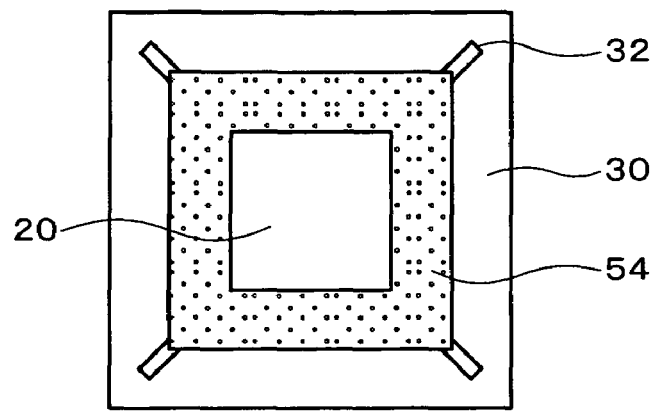
FIG. 5 is illustrative of a method of manufacturing a semiconductor device according to a third embodiment.

FIG. 5 is illustrative of a method of manufacturing a semiconductor device according to the third embodiment of the present invention. The description of the first and second embodiments is applied to the present embodiment except for the configuration and shape of the adhesive sheet 54.

The third embodiment shown in FIG. 5 uses the porous adhesive sheet 54 which discharges voids (air) used in the second embodiment. The protective film 30 is formed to be provided with the grooves 32 at the corners of the rectangular opening 26 formed in the first embodiment.

In the present embodiment, the adhesive sheet 54 is attached to the area including the opening 26 and the boundary between the opening 26 and the protective film 30. The adhesive sheet 34 is attached except at least a part of the groove 32. The adhesive sheet 34 may be attached so that the end of the groove 32 is exposed from the adhesive sheet 34. The adhesive sheet 54 is then softened by heating using the method described in the first embodiment.

The softened adhesive sheet 54 adheres to the level difference between the interconnect pattern 12 and the substrate 10 and the level difference between the interconnect pattern 12 and the protective film 30. Air pushed out from the level difference or gap by the softened adhesive sheet 54 and air expanded by heating are discharged to the outside through the holes in the porous adhesive sheet 54 and the grooves 32 which connect with the corners of the opening 26.

According to the present embodiment, since air does not remain between the adhesive sheet 54 and the substrate 10, voids are rarely formed. Therefore, a method of manufacturing a highly reliable semiconductor device which exhibits effects the same as the effects described in the first embodiment, even having a structure in which the interconnect pattern 12 is covered with the adhesive sheet 54, can be provided.

Modification

Figure 6:
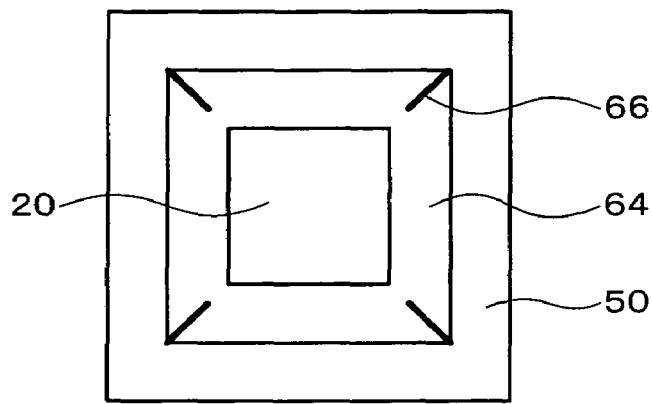
FIG. 6 shows a modification of a method of manufacturing a semiconductor device according to an embodiment of the present invention.
Figure 7:
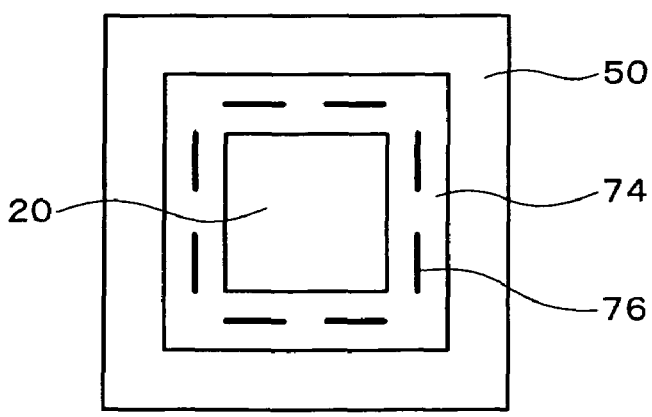
FIG. 7 shows another modification of a method of manufacturing a semiconductor device according to an embodiment of the present invention.

FIGS. 6 and 7 are illustrative of a modification of the embodiment of the present invention.

In the modification of a method of manufacturing a semiconductor device shown in FIG. 6, a plurality of cuts 66 are formed in an adhesive sheet 64 so as to separate the edges of the adhesive sheet 64. The cuts 66 may be formed at the corners or may be formed on the sides.

According to this modification, the adhesive sheet 64 softened by heating using the method described in the first embodiment (see FIG. 1A) hangs in a direction determined by gravity. The softened adhesive sheet 64 fills the level difference between the interconnect pattern 12 and the substrate 10 and the level difference between the interconnect pattern 12 and the protective film 50. Air pushed out from the gap by the softened adhesive sheet 64 and air expanded by heating are discharged to the outside through the cuts 66. The protective film may be the protective film 30 having the grooves 32 illustrated in the first embodiment.

In the modification of a method of manufacturing a semiconductor device shown in FIG. 7, a plurality of cuts 76 are formed in an adhesive sheet 74 along the boundary between the opening 56 and the protective film 50 illustrated in the second embodiment. The cut 76 may be formed parallel to each side as shown in FIG. 7, or may be formed obliquely to each side.

According to this modification, the adhesive sheet 74 softened by heating using the method described in the first embodiment (see FIG. 1A) hangs in a direction determined by gravity. The softened adhesive sheet 74 adheres to the level difference between the interconnect pattern 12 and the substrate 10 and the level difference between the interconnect pattern 12 and the protective film 50. Air present in the level difference between the interconnect pattern 12 and the protective film 50 can be efficiently discharged to the outside through the cuts 76. The protective film may be the protective film 30 having the grooves 32 illustrated in the first embodiment.

According to the modification of the above-described embodiment, a method of manufacturing a highly reliable semiconductor device which exhibits effects the same as the effects described in the first embodiment, even having a structure in which the interconnect pattern 12 is covered with the adhesive sheet, can be provided.

Semiconductor Device

A highly reliable semiconductor device even having a structure in which the protective film is covered with the adhesive sheet can be provided by using the above-described method of manufacturing a semiconductor device.

Circuit Board and Electronic Instrument

Figure 8:
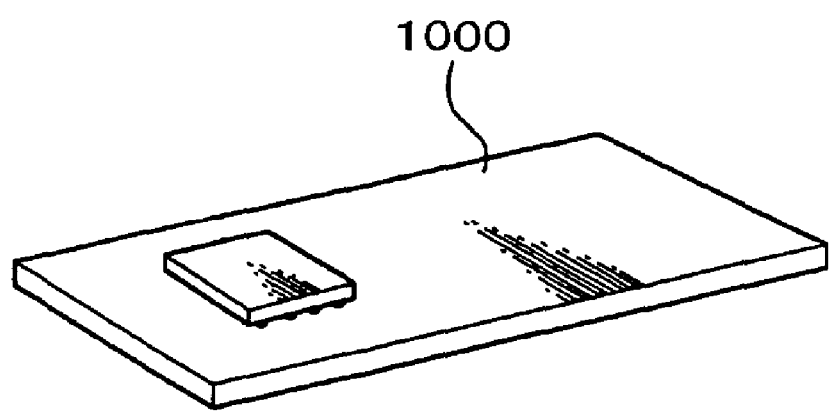
FIG. 8 shows a circuit board according to an embodiment of the present invention.
Figure 9:
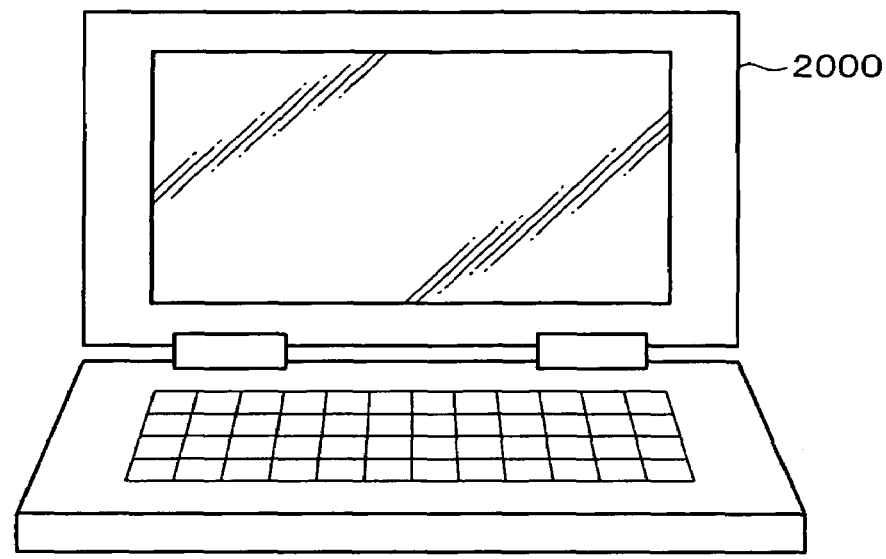
FIG. 9 shows an electronic instrument according to an embodiment of the present invention.
Figure 10:
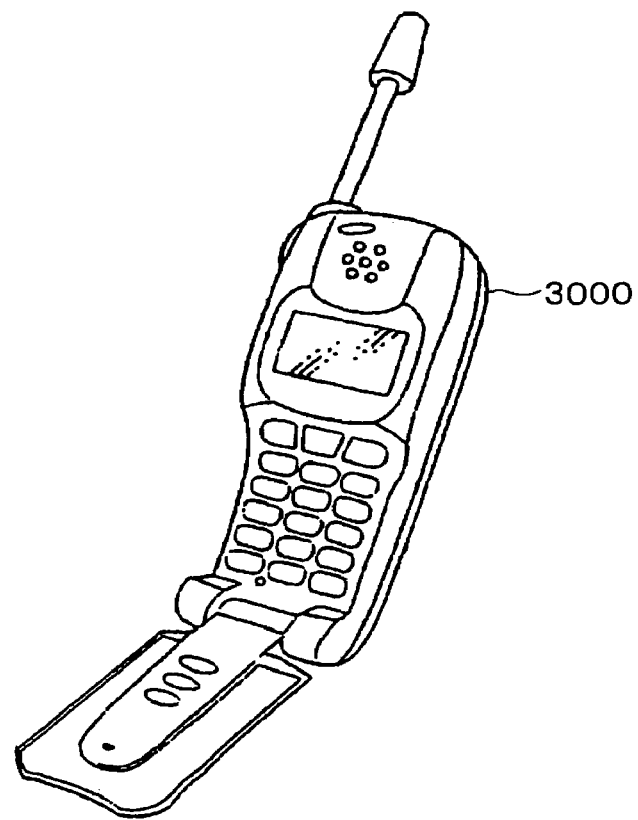
FIG. 10 shows another electronic instrument according to an embodiment of the present invention.

FIG. 8 shows a circuit board 1000 on which the semiconductor device according to the embodiment of the present invention is mounted. FIG. 9 shows a notebook-type personal computer 2000 as an electronic instrument including the semiconductor device. FIG. 10 shows a portable telephone 3000.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A method of manufacturing a semiconductor device using a substrate on which an interconnect pattern is formed and on which a protective film is formed to include a rectangular opening and to cover the interconnect pattern in a region other than the opening, the method comprising:

attaching an adhesive sheet to an area including the opening and a boundary between the opening and the protective film so that a void is formed in the opening due to a level difference between the interconnect pattern and the substrate;

softening the adhesive sheet by heating; and causing a semiconductor chip to adhere to the substrate through the adhesive sheet, wherein the protective film includes a groove which connects with a corner of the opening, wherein the adhesive sheet is attached except at least a part of the groove, a plurality of cuts are formed on an end of the adhesive sheet and wherein the void is discharged through the groove by heating and softening the adhesive sheet.

2. The method of manufacturing a semiconductor device as defined in claim 1, wherein the adhesive sheet is a porous adhesive sheet which allows the void to be discharged.

3. The method of manufacturing a semiconductor device as defined in claim 1, wherein the cuts are formed to reach the boundary between the opening and the protective film.

4. The method of manufacturing a semiconductor device as defined in claim 1, wherein conductive particles are dispersed in the adhesive sheet, and wherein the interconnect pattern and an electrode of the semiconductor chip are electrically connected through the conductive particles.

5. A method of manufacturing a semiconductor device using a substrate on which an interconnect pattern is formed and on which a protective film is formed to include a rectangular opening and to cover the interconnect pattern in a region other than the opening, the method comprising:

attaching an adhesive sheet to an area including the opening and a boundary between the opening and the protective film so that a void is formed in the opening due to a level difference between the interconnect pattern and the substrate;

softening the adhesive sheet by heating; and causing a semiconductor chip to adhere to the substrate through the adhesive sheet, wherein the protective film includes a groove which connects with a corner of the opening, wherein the adhesive sheet is attached except at least a part of the groove, the adhesive sheet is an insulating sheet, and wherein the void is discharged through the groove by heating and softening the adhesive sheet.

6. A method of manufacturing a semiconductor device using a substrate on which an interconnect pattern is formed and on which a protective film is formed to include a rectangular opening and to cover the interconnect pattern in a region other than the opening, the method comprising:

attaching a porous adhesive sheet to an area including the opening and a boundary between the opening and the protective film so that a void is formed in the opening due to a level difference between the interconnect pattern and the substrate;

softening the adhesive sheet by heating and discharging the void through the porous adhesive sheet;

forming a plurality of cuts on an end of the adhesive sheet; and causing a semiconductor device to adhere to the substrate through the adhesive sheet.

7. The method of manufacturing a semiconductor device as defined in claim 6, wherein the cuts are formed to reach the boundary between the opening and the protective film.

8. The method of manufacturing a semiconductor device as defined in claim 6, wherein conductive particles are dispersed in the adhesive sheet, and wherein the interconnect pattern and an electrode of the semiconductor chip are electrically connected through the conductive particles.

9. The method of manufacturing a semiconductor device as defined in claim 6, wherein the adhesive sheet is an insulating sheet.

10. A semiconductor device manufactured by the method as defined in claim 1.

11. A semiconductor device manufactured by the method as defined in claim 6.

12. A circuit board having the semiconductor device as defined in claim 10 mounted on the circuit board.

13. A circuit board having the semiconductor device as defined in claim 11 mounted on the circuit board.

14. Electronic instrument having the semiconductor device as defined in claim 10.

15. Electronic instrument having the semiconductor device as defined in claim 11.

* * * * *